(12) United States Patent
Schoeppach et al.

(10) Patent No.: US 9,175,948 B2
(45) Date of Patent: Nov. 3, 2015

(54) OPTICAL MODULE WITH A MEASURING DEVICE

(71) Applicant: Carl Zeiss SMT GmbH, Oberkochen (DE)

(72) Inventors: Armin Schoeppach, Aalen (DE); Stefan Hembacher, Bobingen (DE); Guido Limbach, Aalen (DE); Jens Kugler, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 68 days.

(21) Appl. No.: 14/070,702

(22) Filed: Nov. 4, 2013

(65) Prior Publication Data

US 2014/0125995 A1    May 8, 2014

Related U.S. Application Data

(63) Continuation of application No. PCT/EP2012/057916, filed on Apr. 30, 2012.

(30) Foreign Application Priority Data

May 5, 2011  (DE) .......................... 10 2011 075 316

(51) Int. Cl.
*G01B 11/14* (2006.01)
*G03F 7/20* (2006.01)
*G02B 26/06* (2006.01)
*G02B 26/08* (2006.01)

(52) U.S. Cl.
CPC ................ *G01B 11/14* (2013.01); *G02B 26/06* (2013.01); *G02B 26/0825* (2013.01); *G03F 7/70266* (2013.01); *G03F 7/70825* (2013.01)

(58) Field of Classification Search
CPC .... G02B 26/0825; G02B 7/182; G02B 7/198; G01B 11/16; G01B 11/14
USPC .......... 356/601–623; 359/198, 224, 811, 291, 359/298, 223, 822, 849, 812, 872, 846; 355/52, 53
See application file for complete search history.

(56) References Cited

U.S. PATENT DOCUMENTS

| 5,189,493 | A  | * | 2/1993 | Harding ........................ 356/605 |
| 6,445,481 | B2 | * | 9/2002 | Aoki .......................... 359/198.1 |
| 6,842,277 | B2 |   | 1/2005 | Watson |

(Continued)

OTHER PUBLICATIONS

The International Search Report and Written Opinion for corresponding PCT Appl No. PCT/EP2012/057916, dated Aug. 3, 2012.

(Continued)

*Primary Examiner* — Hoa Pham
(74) *Attorney, Agent, or Firm* — Fish & Richardson P.C.

(57) ABSTRACT

An optical module, in particular for microlithography, with an optical element unit, a support device, a deformation device and a measuring device is disclosed. The support device is supported on the optical element unit, whereas for deforming an optical surface of the optical element unit, the deformation device engages a deformation section of the optical element unit comprising the optical surface. For determining the position and/or the orientation of the optical element unit with respect to an external reference in at least one degree of freedom, the measuring device comprises at least one measuring element, wherein the measuring element is arranged on a reference section of the optical element unit.

21 Claims, 4 Drawing Sheets

(56) References Cited

U.S. PATENT DOCUMENTS

| | | | |
|---|---|---|---|
| 7,443,619 B2 | 10/2008 | Sakino et al. | |
| 7,859,643 B2 * | 12/2010 | Asada | 355/53 |
| 2002/0012108 A1 * | 1/2002 | Hara | 355/53 |
| 2004/0017623 A1 * | 1/2004 | Watson | 359/849 |
| 2007/0280609 A1 | 12/2007 | Ito | |
| 2007/0286035 A1 | 12/2007 | Uchida | |
| 2009/0310145 A1 | 12/2009 | Sugiyama et al. | |
| 2011/0075282 A1 * | 3/2011 | Aoki et al. | 359/846 |

OTHER PUBLICATIONS

The International Preliminary Report on Patentability for corresponding PCT Appl No. PCT/EP2012/057916, dated Nov. 5, 2013.

* cited by examiner

OPTICAL MODULE WITH A MEASURING DEVICE

BACKGROUND OF THE INVENTION

The present invention relates to an optical module, an optical element unit for the optical module and a method for determining the position and/or the orientation of an optical element unit. The invention can be used in connection with microlithography employed in the fabrication of microelectronic circuits.

In particular in the area of microlithography, in addition to the use of components made with the highest possible accuracy, it is necessary, among other things, to position the components of the imaging device, for example the optical elements such as lenses or mirrors, as precisely as possible, in order to achieve a correspondingly high image quality. The high requirements on accuracy, which are in the microscopic range of the order of magnitude of a few nanometers or less, are not least a consequence of the constant need to increase the resolution of the optical systems used in the fabrication of microelectronic circuits, in order to drive forward the miniaturisation of the microelectronic circuits that are to be produced.

With the increased resolution and, therefore, as a rule the concomitant decrease in wavelength of the light used, it is not only the requirements on the positional accuracy of the optical elements used that increase. Naturally, there is also an increase in the requirements with respect to minimising the imaging errors of the whole optical arrangement.

To minimise the imaging errors, it is known, for example from U.S. Pat. No. 6,842,277 B2 (Watson; the complete disclosure of which is incorporated herein by reference) and U.S. Pat. No. 7,443,619 B2 (Sakino et al.; the complete disclosure of which is incorporated herein by reference), to actively deform the optically active surfaces of one or a plurality of optical elements of the imaging system, in order to correct wavefront aberrations. To this end, for example, a number of actuators supported by a support structure of the mirror engage a back side of a mirror and introduce the corresponding forces and/or moments into the mirror, in order to achieve a desired deformation of the mirror surface relative to a setpoint geometry or rigid body geometry of the mirror.

These forces and/or moments for deformation of the mirror surface may as a rule also lead to a change in the position and/or orientation of the mirror (insofar as it is regarded as an infinitely rigid body), which in its turn must be corrected. The terms rigid body position or rigid body orientation of the optical element are often used in this context.

Correction of the position and/or orientation of the optical element is typically based on the measuring signals of one or a plurality of sensors, which detect the position and/or orientation of the optical element with respect to at least one reference, as is also known from U.S. Pat. No. 6,842,277 B2. A critical factor is that the deformation can cause a relative movement in the region of the measurement point, although the rigid body position or rigid body orientation of the optical element has not changed, or not to the extent captured by the sensors, so that corrections of the position and/or orientation of the optical element are performed, although these are not required.

A disadvantage of the solution proposed in U.S. Pat. No. 7,443,619 B2 is that the optical element and the deformation device form one unit, which in its turn has to be corrected in its position and/or orientation. If this correction of the rigid body position or orientation must take place very quickly, a heavy unit is a disadvantage. Moreover, rapid correction is hampered by cables or the like, which supply the deformation device. Moreover, such a unit requires considerable space, so that attainment of a high resonant frequency of the unit, which would be necessary for favourable control behaviour, becomes much more complicated.

BRIEF SUMMARY OF THE INVENTION

The problem to be solved by the present invention is therefore to provide an optical module, an optical element unit for the optical module and a method for determining the position and/or the orientation of an optical element unit, which does not have the aforementioned disadvantages or at least has them to a smaller extent and, in particular, in a simple manner, makes it possible for imaging errors to be corrected as simply as possible.

A further object to be achieved by the present invention is to provide an optical module, an optical element unit for the optical module and a method for determining the position and/or the orientation of an optical element unit, which offers the possibility of a determination that is as simple as possible and, optionally, of a highly dynamic correction of the rigid body position or rigid body orientation of the optical element.

The present invention is based on the finding that a simple determination and, optionally, a correction of the rigid body position or rigid body orientation of the optical element are made possible if the measuring device for determining the position and/or the orientation of the optical element unit with respect to an external reference in at least one degree of freedom comprises at least one measuring element, which is arranged on a reference section of the optical element unit, which is substantially unaffected by the deformation introduced into the optical element. This can be achieved by a corresponding distance of the reference section and/or a stress decoupling of the reference section from the deformed section. Both have in each case the effect that the deformation stresses (i.e. the stresses that bring about the desired deformation of the optical element) substantially do not propagate into the region of the measuring element and do not notably influence its position and/or orientation. Accordingly, in an advantageous manner, the actual rigid body position and/or rigid body orientation of the optical element can be captured via the measuring element in one or a plurality of degrees of freedom (up to all six degrees of freedom).

One object of the present invention is therefore an optical module, in particular for microlithography, with an optical element unit, a support device, a deformation device and a measuring device. The support device supports the optical element unit, whereas for deforming an optical surface of the optical element unit, the deformation device engages a deformation section of the optical element unit comprising the optical surface. For determining the position and/or the orientation of the optical element unit with respect to an external reference in at least one degree of freedom the measuring device comprises at least one measuring element, wherein the measuring element is arranged on a reference section of the optical element unit. The reference section is arranged at a distance from the deformation section and/or decoupled from the deformation section via at least one decoupling section in such a manner that a deformation of the optical element unit introduced by the deformation device into the deformation section substantially does not propagate into the region of the measuring element.

Another object of the present invention is an optical element unit for an optical module, in particular for microlithography, with a support section for engaging a support device, a deformation section for engaging a deformation device for deforming an optical surface of the optical element unit and a measuring device. For determining the position and/or the orientation of the optical element with respect to an external reference in at least one degree of freedom the measuring device comprises at least one measuring element, wherein the measuring element is arranged on a reference section of the optical element unit. The reference section is arranged at a distance from the deformation section and/or decoupled from the deformation section via at least one decoupling section in such a manner that a deformation of the optical element unit introduced by the deformation device into the deformation section substantially does not propagate into the region of the measuring element.

Another object of the present invention is a method for determining the position and/or the orientation of an optical element unit, in particular for microlithography, in which an optical surface of a deformation section of the optical element unit is deformed and the position and/or the orientation of the optical element unit with respect to an external reference is detected, in at least one degree of freedom, via at least one measuring element, wherein the measuring element is arranged on a reference section of the optical element unit. The reference section is arranged at a distance from the deformation section and/or decoupled from the deformation section via at least one decoupling section in such a manner that a deformation of the optical element unit introduced into the deformation section substantially does not propagate into the region of the measuring element.

Further preferred embodiments of the invention become apparent from the dependent claims or from the following description of preferred embodiments, which make reference to the appended drawings. All combinations of the features disclosed, whether explicitly recited in the claims or not, are within the scope of the invention.

DETAILED DESCRIPTION OF THE INVENTION

First Embodiment

Figure 1:
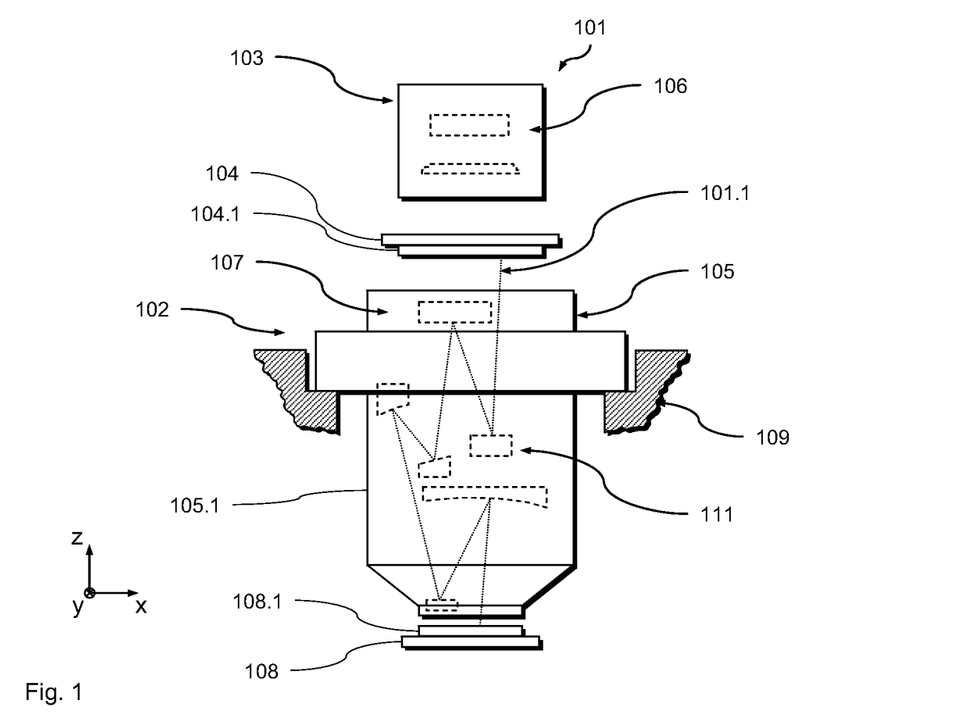
FIG. 1 is a highly schematic representation of an optical imaging device with a preferred embodiment of an optical module according to the invention, with which a preferred embodiment of the method according to the invention can be carried out.
Figure 2:
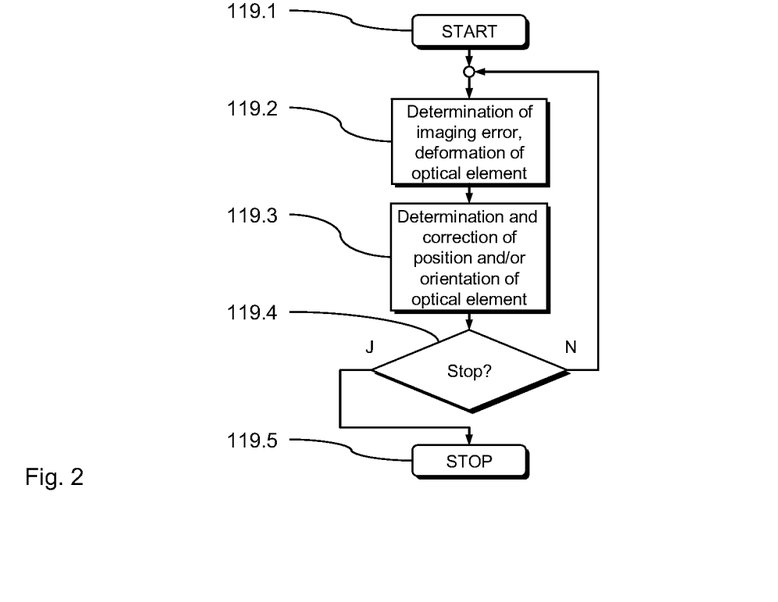
FIG. 2 is a flow chart of a preferred embodiment of the method according to the invention, which can be carried out with the imaging device from FIG. 1.
Figure 3:
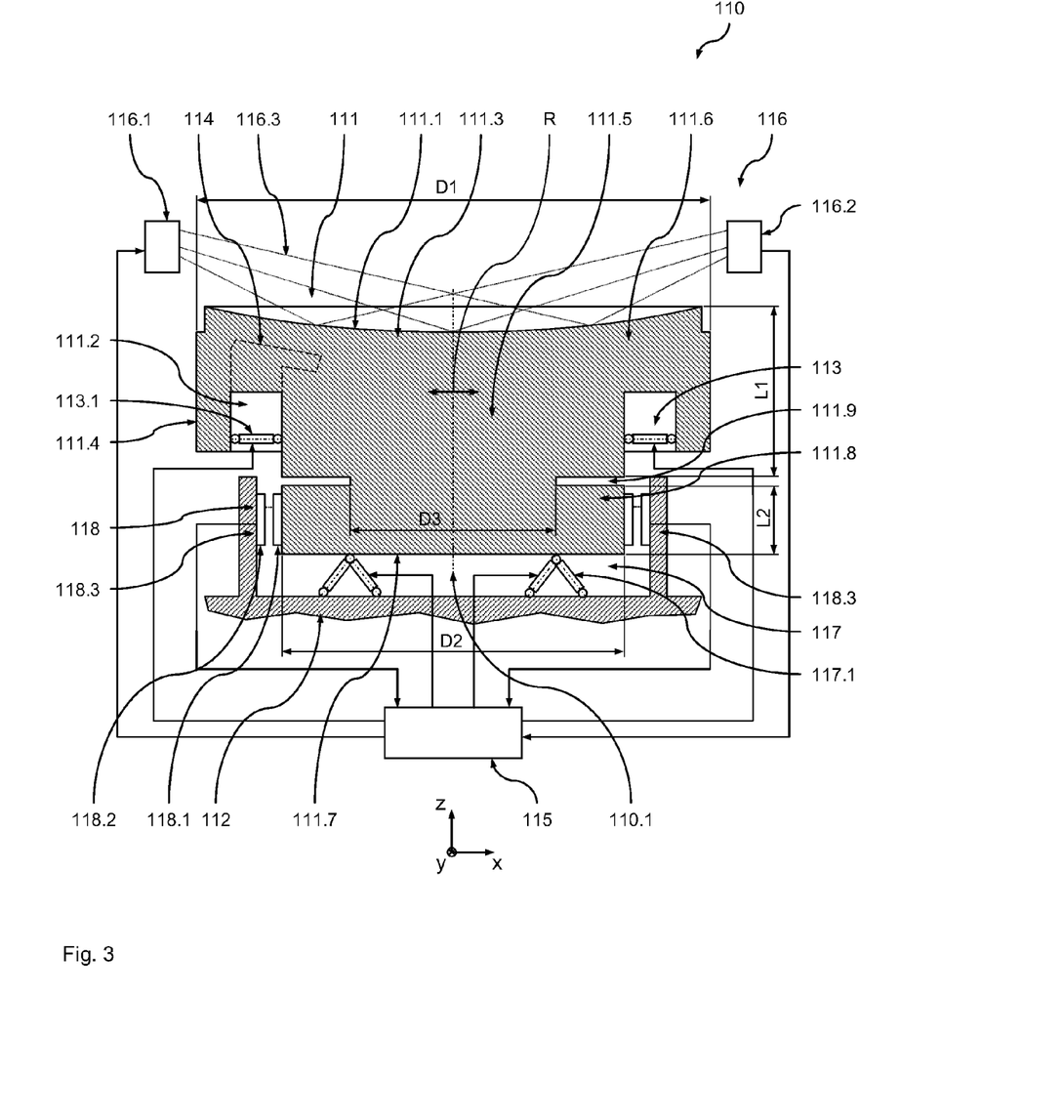
FIG. 3 is a schematic representation of a portion of the imaging device from FIG. 1 with the optical module according to the invention.

Referring to FIGS. 1 to 3, a preferred embodiment of an optical imaging device 101 according to the invention for microlithography is described in the following, which comprises a preferred embodiment of an optical module according to the invention with a preferred embodiment of an optical element unit according to the invention. To simplify the following explanations, an xyz coordinate system is introduced in the figures, and will be referred to hereinafter.

FIG. 1 shows a highly schematic representation of the optical imaging device in the form of a microlithography device 101, which operates with light of a first wavelength in the EUV range (i.e. at a wavelength from 5 nm to 20 nm, typically at about 13 nm). The microlithography device 101 comprises an imaging unit in the form of an optical projection system 102 with an illuminating system 103, a mask device 104 and an optical device in the form of an objective 105. The illuminating system 103 comprises an optical element group 106 and illuminates (via a lightguide device not shown in more detail) the mask 104.1 of the mask device 104 with a projection light beam 101.1 (not shown in more detail in this section).

On the mask 104.1, which is arranged on a mask table 104.2, in an object plane there is a projection pattern, which is projected using the projection light beam 101.1 via the optical elements arranged in the objective 105 into an image plane on a substrate 108.1, for example a so-called wafer, of a substrate device 108.

For this purpose the objective 105 comprises an optical element group 107, which is formed from a number of optical elements 111, which are accommodated in the housing 105.1 of the objective 105, which in turn is supported on a support structure 109. The optical elements 111 project the projection light beam 101.1 onto the substrate 108.1 and thus image an object point of the projection pattern onto an image point on the substrate 108.1.

FIG. 3 shows a preferred embodiment of the optical module according to the invention 110, which comprises an optical element unit in the form of one of the optical elements 111. The optical element 111 is supported by a support device 112 of the optical module 110, and the support device 112, in turn, is supported on the support structure 109 (via the housing 105.1).

In order to be able to correct wavefront aberrations of the projection light beam 101.1 during imaging of the projection pattern onto the wafer 108.1, the optical module 110 comprises on the one hand a deformation device 113. Via the deformation device 113, the optical surface 111.1 of the optical element 111 interacting with the projection light beam 101.1 can be deformed during projection, to counteract undesirable deviations in the wave front of the projection light beam 101.1.

The deformation device 113 comprises for this purpose a number of deformation elements in the form of first actuators 113.1, which in the present example are arranged in a circumferential recess 111.2 provided in a main body 111.3 of the optical element 111 and extending in the circumferential direction U over the entire circumference of the optical element 111.

The circumferential recess 111.2 forms, on the optical element 111, a circumferential peripheral section 111.4 in the circumferential direction U and a central base section 111.5. The first actuators 113.1 are in the present example aligned substantially in the radial direction R of the optical element 111, and therefore lie in a circumferential plane defined by the circumferential direction U. The first actuators 113.1 are supported in each case on the one hand at a first engagement point on the peripheral section 111.4 and on the other hand at a second engagement point displaced inwards in the radial direction R on the base section 111.5.

The recess 111.2 introduces a deliberate structural weakening into the optical element 111, which makes it possible, in a simple manner, via the force of the first actuators 113 applied for example in the radial direction R, to introduce a defined deformation into a deformation section 111.6 of the optical element 111 comprising the optical surface 111.1.

In particular, it is possible to make the recess 111.2 and therefore the deliberate weakening of the optical element 111 non-uniform, corresponding to the desired deformation in any directions in space, in particular in the circumferential direction U and/or the radial direction R, as indicated in FIG. 3 by the dashed contours 114. It will be understood, however, that in other variants of the invention, in which a substantially symmetrical deformation of the optical surface is desired, a strictly symmetrical arrangement or configuration can also be selected.

It will be understood that, in other variants of the invention, naturally any other configuration of the deformation device can also be selected, in order to achieve the desired deformation of the optical surface. In particular, some other configuration and/or orientation of the first actuators can be selected. Moreover, it is not essential to provide the recess described above. It is merely favourable if the first actuators bear on both sides directly on the optical element and not on an external support structure, as in this way the introduction of parasitic stresses from such an external support structure into the optical element can be avoided in a simple manner.

Control of the deformation of the optical surface 111.1 takes place in the present example via a control device 115 controlling the first actuators 113.1. For this, a first measuring unit 116 of a measuring device, connected to the control device 115, is provided, which comprises a first emitter device 116.1 and an associated first sensor device 116.2. The emitter device 116.1 (under control by the control device 115) sends a measuring light beam 116.3 onto the optical surface 111.1, which is reflected there and is directed onto the sensor device 116.2. On the basis of the signals of the sensor device 116.2 transmitted to the control device 115, a conclusion about the existing deformation of the optical surface 111.1 can then be made in the control device 115. Optionally the control device 115 then controls the first actuators 113.1 according to specified setpoint values, in order to adjust the deformation of the optical surface 111.1.

It will be understood that, in other variants of the invention, the first measuring unit can also be constructed differently, for detecting the deformation of the optical surface. In particular, it can naturally also comprise one or a plurality of first emitter devices and/or a plurality of first sensor devices, which are assigned to the optical element corresponding to the deformation of the optical surface to be detected.

The forces introduced via the first actuators 113.1 into the optical element give rise to mechanical stresses in the deformation section 111.6, which lead to a corresponding deformation of the deformation section and, accordingly, are designated in the sense of the present application as deformation stresses.

In addition to the deformation of the optical surface 111.1, in the present example, a correction of the rigid body position (i.e. of the translation in the three translational degrees of freedom in space) and of the rigid body orientation (i.e. of the rotation about the three rotational degrees of freedom in space) is also possible. These settings of the rigid body position and rigid body orientation in all six degrees of freedom are achieved in the following example via a positioning device 117, which is also controlled by the control device 115.

The positioning device 117 comprises for this purpose a number of second actuators 117.1, which, in the present example, are arranged in the manner of parallel kinematics in the form of a hexapod (which is constructed conventionally from three bipods arranged uniformly distributed in the circumferential direction U).

It will be understood, however, that in other variants of the invention, any other configuration of the positioning device, in particular any other configuration and arrangement of the second actuators, can also be selected. In particular, it can naturally also be envisaged that, depending on the requirements of the particular imaging device, the setting of the rigid body position and/or of the rigid body orientation of the optical element takes place in fewer than six degrees of freedom.

The positioning device 117 is supported on the one hand on the support structure 112 and engages a reference section 111.8 of the optical element 111 in the region of the back side 111.7 of the optical element 111 facing away from the optical surface 111.1. The reference section 111.8 is formed on a projection, which projects on the back 111.7 of the optical element 111 from the substantially disk-shaped deformation section 111.6.

The reference section 111.8 carries, on its outer circumference, a first measuring element 118.1 of a second measuring unit 118 of the measuring device, which serves for detecting the rigid body position and the rigid body orientation of the optical element. For this, a second measuring element 118.2, which is arranged on the support structure 112, is assigned to the first measuring element 118.1.

At the circumference of the reference section 111.8, a plurality of measuring element pairs 118.3 consisting of a first measuring element 118.1 and a second measuring element 118.2 are provided, so as to be able to detect the rigid body position and the rigid body orientation of the optical element 111 in all six degrees of freedom.

It will be understood that the number of measuring element pairs 118.3 depends on the number of degrees of freedom to be detected and on the redundancy that is optionally required in this context. In certain variants of the invention, optionally even a single measuring element pair may be sufficient.

In the present example, the first measuring element 118.1 is a simple, passive reference element, which interacts in a suitable, adequately known way with the second measuring element 118.2 designed as active component, in order to transmit a corresponding measuring signal to the control device 115 connected to the second measuring element 118.2.

Based on this measuring signal and the measuring signals of the other measuring element pairs 118.3, the control device 115 can then determine the current rigid body position and rigid body orientation of the optical element 111. Depending on certain requirements arising from the current imaging process of the imaging device 101, the control device 115 can then control the second actuators 117.1, in order to correct the rigid body position and rigid body orientation of the optical element 111 in the desired manner.

It will be understood that the measuring element pairs can operate according to any suitable operating principle that provides suitable information about the relative position of the two measuring elements. For example, measuring element pairs operating by interferometry can be used, where the first measuring element is then in the form of a simple reflector. Measuring element pairs operating according to an encoder principle can also be envisaged, wherein the first measuring element can then for example be a corresponding one- or two-dimensional grating or the like.

It will be understood, moreover, that the first measuring element need not necessarily be a passive element. However, configuration as a passive element has the advantage that no kind of mechanical connection, for example via signal leads or the like, is necessary between the optical element and the support structure, so that the risk of introducing parasitic stresses via such a connection is eliminated in an particularly simple manner.

The deformation device 113 exerts, in normal operation of the optical module 110, at most a specified maximum force $F_{max}$ on the optical element 111. From this maximum force $F_{max}$, deformation stresses with a maximum first deformation stress $DS1_{max}$ result in the deformation section 111.5.

To prevent the deformation introduced via the deformation device 113 into the optical element 111 affecting the measurement result of the second measuring unit 118 and therefore notably corrupting the measurement of the current rigid body position and rigid body orientation of the optical element 111 through deformation in the region of the first measuring element 118.1, the reference section 111.8 with the first measuring element 118.1 is designed and arranged at a distance from the optical surface 111.1 in such a manner that from the maximum force effect $F_{max}$ of the deformation device 113, in the reference section 111.8, a stress distribution results having a maximum second deformation stress $DS2_{max}$.

The maximum second deformation stress $DS2_{max}$ is in the present example less than 3% of the maximum first deformation stress $DS1_{max}$. This has the advantage that, in normal operation of the imaging device 101, there is no noteworthy corruption of the measurement result of the second measuring unit 118, so that the correct rigid body position and rigid body orientation of the optical element 111 are always detected and no false corrections occur via the positioning device 117.

It will be understood that, in other variants of the invention, greater deformation of the reference section can also be permitted. This may be the case, in particular, when the measurement of the second measuring unit is not sensitive to the deformation to be expected (for example when the deformation to be expected occurs in a degree of freedom that differs from or is independent from the degree of freedom to be detected).

Preferably, however, the reference section is designed and arranged in such a way that the maximum second deformation stress $DS2_{max}$ is less than 20% of the maximum first deformation stress $DS1_{max}$. In favourable configurations the maximum second deformation stress $DS2_{max}$ is at most 10% of the maximum first deformation stress $DS1_{max}$, preferably at most 3% of the maximum first deformation stress $DS1_{max}$.

In the present example, the advantageously low second deformation stress $DS2_{max}$ is achieved on the one hand because the reference section 111.8 is located at a sufficiently large distance from the deformation section 111.6 or the optical surface 111.1, so that the deformation stresses have largely degraded before they reach the reference section 111.8.

On the other hand, the reference section 111.8 is mechanically decoupled from the deformation section 111.6 via a decoupling device 111.9, above all from the contact points of the deformation device 113, so that direct introduction of deformation stresses into the reference section 111.8, in particular into the region with the second measuring unit 118, is reliably prevented.

The decoupling device 111.9, in the present example, takes the form of a simple, circumferential recess in the main body 111.3 of the optical element 111. It will be understood, however, that in other variants of the invention, instead of such a constriction of the main body of the optical element, any other mechanical decoupling can also be provided between the deformation section and the reference section.

Furthermore, it will be understood that, in other variants of the invention, this additional decoupling can also be omitted. In that case the introduction of deformation stresses into the reference section can for example be avoided simply by a sufficiently large distance between the reference section and the deformation section.

Both measures (arrangement with increased distance and decoupling of the reference section 111.8 from the deformation section 111.6) thus have the effect that a deformation of the optical element 111 introduced via the deformation device 113 into the deformation section 111.6 does advantageously substantially not propagate into the region of the first measuring element 118.1.

As already described above, the deformation section 111.6 is in the form of a substantially disk-shaped body, which in the present example defines a center axis 111.10.

This center axis 111.10 can be an axis of symmetry of the optical element 111, such as is the case for example with rotationally symmetrical elements. However, in the case of optical elements that do not have such an axis of symmetry, for example aspherical optical elements, it can also be the axis normal to the optical surface passing through the centroid of area of the optical surface.

The projection with the reference section 111.8 is in the present example arranged essentially concentrically with the center axis 111.10. It will be understood, however, that in other variants of the invention an arrangement of the reference section differing from this can also be envisaged.

In preferred variants of the present invention (with dimensioning differing from the dimensioning shown in FIG. 3), the deformation section 111.6 has a maximum first longitudinal dimension L1 in a longitudinal direction in the direction of the center axis 111.10, whereas the projection with the reference section 111.8 in this longitudinal direction has a maximum second longitudinal dimension L2, wherein the second longitudinal dimension L2 is more than 80% of the first longitudinal dimension L1. Preferably the second longitudinal dimension L2 is more than 100% of the first longitudinal dimension L1, in particular more than 150% of the first longitudinal dimension L1. Such a configuration has the advantage that merely through the resultant large distance between the reference section 111.8 and the deformation section 111.6, the introduction of deformations into the reference section 111.8, which could corrupt the measurement result of the second measuring unit 118, is reliably prevented.

Moreover, the deformation section 111.6 has a maximum first transverse dimension D1 in a transverse direction running transversely to the center axis 111.10, whereas the projection with the reference section 111.8 in this transverse direction has a maximum second transverse dimension D2. The second transverse dimension D2 is in the present example less than 80% of the first transverse dimension D1. In further preferred variants of the invention the second transverse dimension D2 is less than 60% of the first transverse dimension D1, in particular less than 40% of the first transverse dimension.

It should be mentioned at this point that it is advantageous if the recess 111.9 forming the decoupling device is made as deep as possible, to achieve greatest possible decoupling. In preferred variants of the invention, the main body 111.3, in the region of the recess 111.9, has a maximum third transverse dimension D3 in the transverse direction, which is less than 80% of the second transverse dimension D2. In further preferred variants of the invention the third transverse dimension D3 is less than 60% of the second transverse dimension D2, in particular less than 40% of the second transverse dimension D2.

The optical element or the optical element unit 111, respectively, is designed in the present example as a monolithic element of a material with a coefficient of thermal expansion close to zero. It will be understood, however, that in other variants of the invention a multipart configuration of the optical element unit can also be envisaged. In particular, the deformation section and the reference section can be made of different components. The decoupling device can also then be formed from one or more separate elements.

FIG. 2 shows a flow chart of a preferred embodiment of the method according to the invention for determining the position and/or the orientation of an optical element unit, which is carried out in the context of an imaging process in the form of a microlithography process, which for its part is carried out with the microlithography device 101 as shown in FIGS. 1 and 3, operating according to the so-called scanner principle.

First, in a step 119.1, the procedure of the microlithography process is started, wherein the microlithography device 101 is provided in the configuration seen in FIGS. 1 and 3.

In a deformation step 119.2, first a determination of the imaging error takes place in a determination step in parallel with the illumination of the substrate 108.1. Based on the imaging error determined, a deformation of the optical element 111 then takes place via the deformation device 113 in the manner described above, in order to counteract this imaging error.

In a step 119.3, the determination described above in connection with FIGS. 1 and 3 and optionally correction of the rigid body position and rigid body orientation of the optical element 111 take place subsequent to or parallel with the deformation step 119.2 via the positioning device 117, also serving to reduce the imaging error.

As mentioned, the determination and correction of the deformation and of the rigid body position and rigid body orientation of the optical element 111 takes place in parallel with the illumination of the substrate 108.1. At least as long as no imaging errors are detected that would make termination of the illumination of the substrate 108.1 necessary, the illumination thus takes place simultaneously with and independently of the determination and correction of the imaging error.

In a further step 119.4, it is then verified whether yet another correction operation should be performed. If this is not the case, the procedure is ended in step 119.5. Otherwise it jumps back to step 119.2.

Second Embodiment

In the following, referring to FIGS. 1, 2 and 4, another preferred embodiment of an optical module according to the invention 210 is described, which can be used instead of the optical module 110 in the microlithography device 101 shown in FIG. 1.

The optical module 210, in its design and functionality, basically corresponds to the optical module 110 in FIG. 3, so only the differences will be discussed here. In particular, components of the same kind are given a reference numeral increased by 100. Unless stated otherwise below, with regard to the properties of these components, reference is made to the explanations given above in connection with the first embodiment.

The optical module 210 differs from optical module 110 in the connection of the positioning device 217 to the optical element 211. As can be seen from FIG. 4, in the present example, connection takes place via a decoupling device in the form of a decoupling ring 219, which is connected via decoupling elements 219.1 to the main body 211.3 of the optical element 211. The decoupling elements 219.1 serve in a conventional manner, on the one hand, to at least reduce the introduction of parasitic stresses from the support structure 212 into the optical element 211, and to compensate different thermal expansions of the coupled components.

The decoupling elements 219.1 engage the main body 211.3 of the optical element 211 in the region of the deformation section 211.6. This has the advantage that the reference section 211.8 is located both outside of the force flux of the forces introduced by the deformation device 213 into the optical element 211 and outside of the force flux of the forces introduced by the positioning device 217 into the optical element 211. The introduction of (as a rule dynamic) stresses, which result from the force effect of the positioning device 217, into the reference section 211.8 is also at least largely prevented in this way, so that corruption of the measurement result of the second measuring unit 218 by the stresses and the resultant deformation are also avoided.

It will be understood that for connecting to the support structure, the decoupling device need not necessarily be designed as a decoupling ring. Rather, any other configuration can be selected that achieves the corresponding decoupled connection of the optical element to the support structure. Furthermore, it will be understood that, in other variants of the invention, the decoupling device can even be omitted, so that therefore the positioning device is connected directly to the main body of the optical element.

Figure 4:
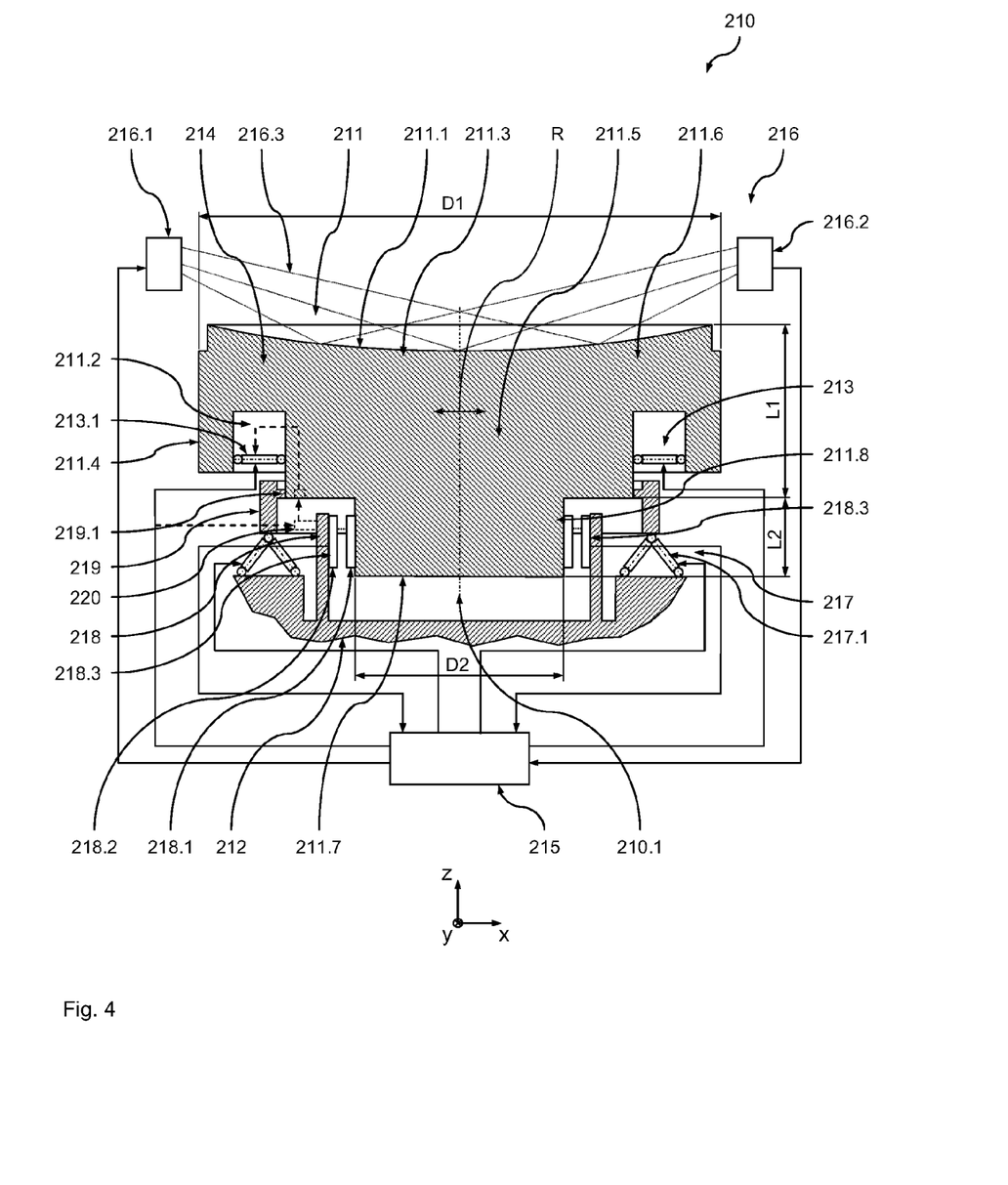
FIG. 4 is a schematic representation of another preferred embodiment of the optical module according to the invention.

As can also be seen from FIG. 4, the reference section 211.8 is formed by a projection on the back 211.7 of the optical element 211 facing away from the optical surface 211.1, the maximum second transverse dimension D2 of which corresponds to about 40% of the maximum first transverse dimension D1 of the deformation section 211.6. Furthermore, once again the dimensions described above in connection with the first example can be selected.

As can also be seen from FIG. 4, in certain variants of the invention a coupling device of a supply device can be provided, via which contactless coupling of the control signals and/or of power for the first actuators 213.1 of the deformation device 213 takes place, as is indicated by the dashed contour 220. This contactless coupling device 220 can operate according to any suitable operating principle. For example, an inductive operating principle can be used. Such a configuration has the advantage that the introduction of parasitic stresses, which might take place via the connecting lines to the first actuators 213.1, is avoided.

For the case when in operation (for example for adjustment of the settings) large travels of the optical element 211 must be performed, it can be envisaged that the portion of the coupling device 220 supported on the support structure follows the optical element 211, for always ensuring reliable coupling of the signals and/or power. For this purpose, this portion of the coupling device can be arranged on a movable carrier or the like, correspondingly controlled by the control device 115.

It should be mentioned at this point that with the optical module 210, which is used in the imaging device 101, naturally once again the method described in connection with FIG. 2 can be carried out, so that to that extent reference is merely made to the explanations given above.

Third Embodiment

In the following, referring to FIGS. 1, 2 and 5, another preferred embodiment of an optical module according to the invention 310 is described, which can be used instead of the optical module 110 in the microlithography device 101 shown in FIG. 1.

The optical module 310, in its design and functionality, basically corresponds to the optical module 110 in FIG. 3, so that only the differences will be discussed here. In particular, components of the same kind are given a reference numeral increased by 200. Unless stated otherwise below, with regard to the properties of these components, reference is to be made to the explanations given above in connection with the first embodiment.

The optical module 310 differs from the optical module 110 in the connection of the positioning device 317 to the optical element 311. As can be seen from FIG. 5, connection takes place (as in the second embodiment) via a decoupling device in the form of a decoupling ring 319, which is connected via decoupling elements 319.1 to the main body 311.3 of the optical element 311. The decoupling elements 319.1, in a conventional manner, serve, on the one hand, to at least reduce the introduction of parasitic stresses from the support structure 312 into the optical element 311, and to compensate different thermal expansions of the coupled components.

The decoupling elements 319.1 engage the main body 311.3 of the optical element 311 in the region of the deformation section 311.6. This has the advantage that the reference section 311.8 is located both outside of the force flux of the forces introduced by the deformation device 313 into the optical element 311 and outside of the force flux of the forces introduced by the positioning device 317 into the optical element 311. The introduction of (as a rule dynamic) stresses, which result from the force effect of the positioning device 317, into the reference section 311.8 is also at least largely avoided in this way, so that corruption of the measurement result of the second measuring unit 318 by the stresses and the resultant deformation are also avoided.

However, with a corresponding configuration of the positioning device it is also possible to omit the decoupling ring 319 and to connect the positioning device as in the configuration shown in FIG. 3 directly to the main body 311.5.

Figure 5:
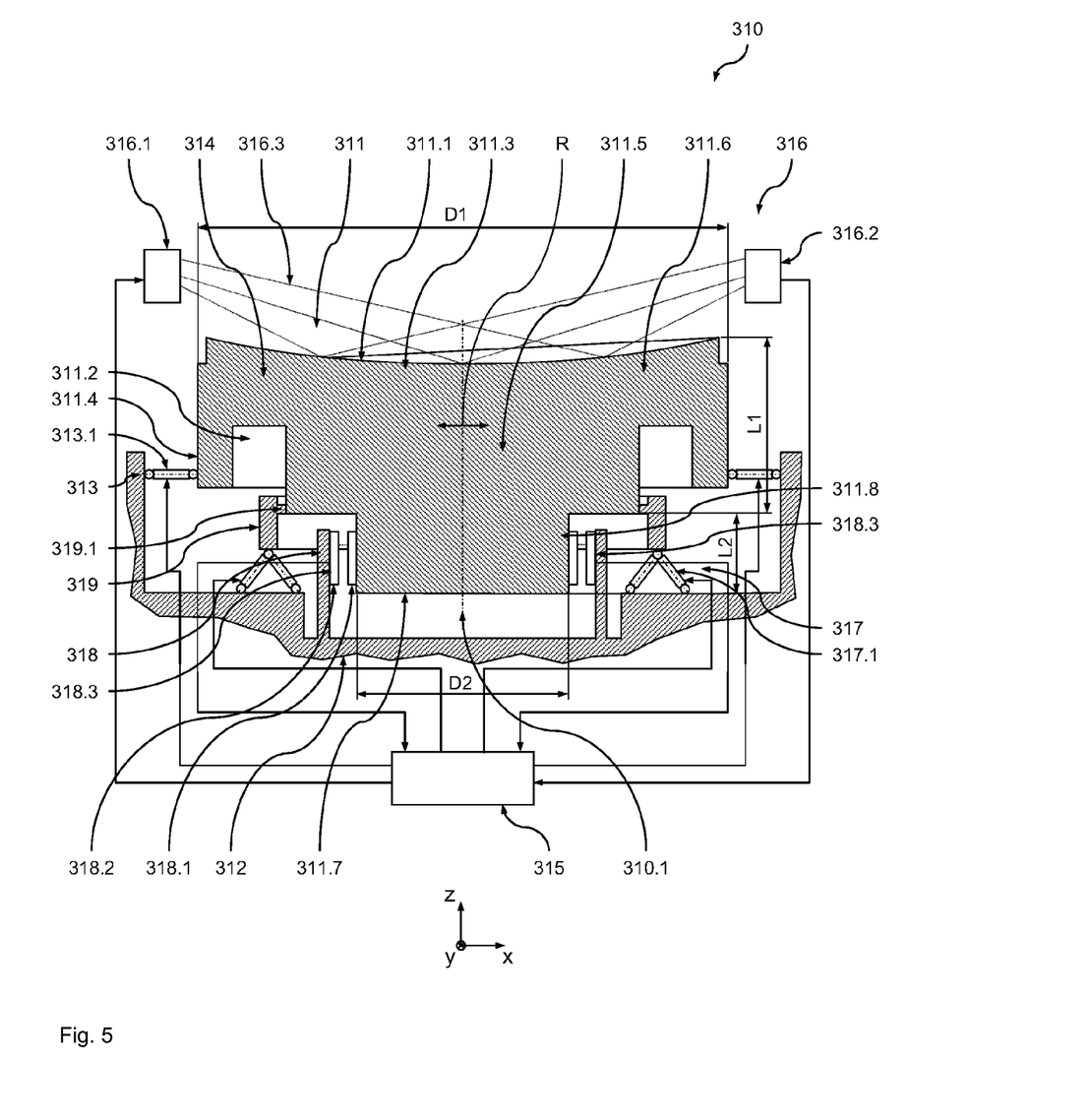
FIG. 5 is a schematic representation of another preferred embodiment of the optical module according to the invention.

As can also be seen from FIG. 5, the reference section 311.8 (as in the second embodiment) is formed by a projection on the back side 311.7 of the optical element 311 facing away from the optical surface 311.1, the maximum second transverse dimension D2 of which corresponds to about 40% of the maximum first transverse dimension D1 of the deformation section 311.6. Furthermore, once again the dimensions described above in connection with the first embodiment can be selected.

As can also be seen from FIG. 5, another difference from the optical module 110 shown in FIG. 3 and FIG. 4 is that the deformation device 313 does not operate exclusively within the optical element 311 but between the optical element 311 and the support structure 312. For this purpose, the first actuators 313.1 engage the outer circumference of the boundary region 311.4 and an associated projection of the support structure 212.

Also in this case, the first actuators 313.1 (at least in the state shown in FIG. 5) operate substantially in the radial direction R in a circumferential plane of the optical element 311 defined by the circumferential direction U of the optical element 311. It will be understood that the actuators 313.1 are designed in such a way that they can follow the travel movements of the optical element 311 produced via the positioning device 317, without altering their force effect on the optical element 311 and therefore the deformation of the optical surface 311.1. For this purpose, they can for example be constructed as force actuators (for example as so-called Lorenz actuators).

Thus, the proposed solution already overcomes the disadvantages mentioned at the beginning, in that the optical element and the deformation device form one unit. With this solution, the unit that is to be moved can be of very much lighter and more compact design. This is advantageous, in particular, with respect to the high resonant frequency of the unit, which is favourable for highly dynamic control. Correction of the rigid body position and/or rigid body orientation can therefore take place very quickly. Moreover, rapid positional correction is not hampered by supply lines to the deformation device (such as cables or the like).

It should be mentioned at this point that with the optical module 310, naturally once again the procedure described in connection with FIG. 2 can be carried out.

The present invention was described above on the basis of examples, operating with illumination of the substrate with wavelengths in the EUV region. However, it should be pointed out at this point that the invention can naturally also be used in connection with applications in which the illumination of a substrate or an imaging of some other kind takes place at different wavelengths.

Furthermore, it should be noted that the present invention was described above with an example from the area of microlithography. It will be understood, however, that the present invention can also be used for any other applications or imaging processes.

The invention claimed is:

1. An optical module, comprising:
   an optical element unit,
   a support device supporting the optical element unit,
   a deformation device configured to deform an optical surface of the optical element unit by engaging a deformation section of the optical element unit which comprises the optical surface; and
   a measuring device comprising a measuring element configured to determine at least one parameter of the optical element unit,
   wherein:
   the parameter of the optical element is selected from the group consisting of a position of the optical unit with respect to an external reference in at least one degree of freedom and an orientation of the optical element with respect to the external reference in at least one degree of freedom;
   the measuring element is arranged on a reference section of the optical element unit; and
   the reference section is decoupled from the deformation section via a decoupling section so that a deformation of the optical element unit introduced by the deformation device into the deformation section substantially does not propagate into the region of the measuring element.

2. The optical module of claim 1, wherein:
   during operation of the optical module, the deformation device, through a maximum force on the optical element unit, produces at most a maximum first deformation stress in the deformation section of the optical element unit;
   the deformation device, through the maximum force at least in the region of the measuring element, produces at most a maximum second deformation stress; and
   the reference section is decoupled from the deformation section via the decoupling section so that the maximum second deformation stress is at most 5% of the maximum first deformation stress.

3. The optical module of claim 1, wherein at least one of the following holds:
   the deformation section is a substantially disk-shaped body; and
   at least a portion of the reference section is formed in the manner of a projection on the deformation section, the measuring element being arranged in the region of an end of the projection facing away from the deformation section.

4. The optical module of claim 3, wherein at least one of the following holds:
   the projection is arranged on the side of the deformation section facing away from the optical surface;

the projection is arranged substantially concentrically with the center axis;

the deformation section has a maximum first longitudinal dimension in a longitudinal direction running in the direction of a center axis, the projection has a maximum second longitudinal dimension in the longitudinal direction, wherein the second longitudinal dimension is more than 80% of the first longitudinal dimension;

the deformation section has a maximum first transverse dimension in a transverse direction running transversely to the center axis, the projection, in the transverse direction, has a maximum second transverse dimension, wherein the second transverse dimension is less than 80% of the first transverse dimension; and the decoupling section is arranged in the region of the projection in a transition region between the deformation section and the projection, the decoupling section being formed by at least one constriction of the cross-section of the projection in the transverse direction.

5. The optical module of claim 1, wherein:
the deformation device comprises a deformation element;
a first end of the deformation element engages a first engagement point of the deformation section;
a second end of the deformation element engages a second engagement point of the deformation section;
the first engagement point is in the region of an outer circumference of the deformation section;
the outer circumference of the deformation section defines a circumferential plane; and
the second engagement point is configured to be inwardly displaced in a radial direction of the circumferential plane.

6. The optical module of claim 1, wherein:
the deformation device comprises a deformation element;
a first end of the deformation element engages a first engagement point of the deformation section; and
a second end of the deformation element engages a second engagement point on the support device.

7. The optical module of claim 1, wherein:
the deformation device engages the region of an outer circumference of the deformation section;
in the region of the outer circumference, the deformation section has a recess that in a circumferential direction extends over the entire outer circumference; and
the recess is configured to achieve a specifiable deformation behavior of the deformation section.

8. The optical module of claim 1, wherein:
the deformation device comprises a deformation element and a supply device configured to supply the deformation element with at least one member selected from the group consisting of energy and control signals; and
the supply device is configured to contactlessly supply of the deformation element with energy and/or control signals.

9. The optical module of claim 1, wherein:
the support device comprises a positioning device configured to set at least one member selected from the group consisting of a position of the optical element in the at least one degree of freedom and an orientation of the optical element unit in the at least one degree of freedom.

10. The optical module of claim 9, wherein at least one of the following holds:
the positioning device engages in the region of the reference section on the optical element unit; and
the positioning device engages the optical element unit via a decoupling device for decoupling parasitic stresses between the positioning device and the optical element unit.

11. The optical module of claim 1, wherein at least one of the following holds:
the optical element unit is monolithic;
the optical element unit comprises a material with a coefficient of thermal expansion close to zero; and
the optical surface comprises a reflective surface.

12. The optical module of claim 1, wherein:
the measuring device is configured to determine a deformation of the optical surface; and
the measuring device is configured so that, to determine the deformation of the optical surface, a measuring light beam is projected onto the optical surface and a part of the measuring light beam deflected by the optical surface is detected by a detecting device.

13. An optical element unit, comprising:
a support section configured to engage a support device;
a deformation section configured to engage a deformation device to deform an optical surface of the optical element unit;
a measuring device,
wherein:
the measuring device comprises a measuring element configured to determine at least one member selected from the group consisting of the position of the optical element with respect to an external reference in at least one degree of freedom and the orientation of the optical element with respect to the external reference in at least one degree of freedom;
the measuring element is arranged on a reference section of the optical element unit,
the reference section is decoupled from the deformation section via a decoupling section so that a deformation of the optical element unit introduced by the deformation device into the deformation section substantially does not propagate into the region of the measuring element.

14. A method, comprising:
deforming an optical surface of a deformation section of an optical element unit; and
detecting at least one member selected from the group consisting of a position of the optical element unit with respect to an external reference in at least one degree of freedom via a measuring element and an orientation of the optical element unit with respect to the external reference in at least one degree of freedom via the measuring element;
wherein:
the measuring element is arranged on a reference section of the optical element unit; and
the reference section is decoupled from the deformation section via at least one decoupling section so that a deformation of the optical element unit introduced into the deformation section substantially does not propagate into the region of the measuring element.

15. The method of claim 14, wherein:
through a maximum force on the optical element unit, at most a maximum first deformation stress is produced in the optical element unit in the deformation section;
through the maximum force effect, at least in the whole reference section, at most a maximum second deformation stress is produced; and
the reference section is decoupled from the deformation section via at least one decoupling section in such a manner that the maximum second deformation stress is at most 5% of the maximum first deformation stress.

16. The method of claim 14, further comprising:
introducing a first force at a first engagement point of the deformation section via a deformation element to deform to deform the optical surface; and
introducing a second force at a second engagement point of the deformation section via the deformation element to deform the optical surface,
wherein the first engagement point is in the region of an outer circumference of the deformation section, the outer circumference of the deformation section defines a circumferential plane, and the second engagement point is inward in a radial direction of the circumferential plane.

17. The method of claim 14, wherein:
introducing a first force at a first engagement point of the deformation section via a deformation element to deform the optical surface; and
introducing a second force into a support device to deform the optical surface.

18. The method of claim 14, wherein:
the deformation takes place via at least one deformation element; and
the at least one deformation element is contactlessly supplied with at least one member selected from the group consisting of energy and control signals.

19. The method of claim 14, further comprising setting a position and/or an orientation of the optical element unit via a positioning device.

20. The method according to claim 19, wherein at least one of the following holds:
the positioning device engages the optical element unit in the region of the reference section; and
the positioning device engages the optical element unit via a decoupling device for decoupling parasitic stresses between the positioning device and the optical element unit.

21. The method of claim 14, further comprising determining the deformation of the optical surface is determined by projecting a measuring light beam onto the optical surface, and detecting a part of the measuring light beam deflected by the optical surface.

* * * * *